United States Patent [19]

Baumgartner

[11] 4,158,129
[45] Jun. 12, 1979

[54] ELECTRONIC COUNTER

[75] Inventor: Alfons Baumgartner, Tranreut, Fed. Rep. of Germany

[73] Assignee: Dr. Johannes Heidenhain GmbH, Traunreut, Fed. Rep. of Germany

[21] Appl. No.: 853,206

[22] Filed: Nov. 21, 1977

[30] Foreign Application Priority Data

Dec. 11, 1976 [DE] Fed. Rep. of Germany ....... 2656304

[51] Int. Cl.$^2$ ............................................. G06M 3/14
[52] U.S. Cl. .......................... 235/92 CA; 235/92 EV; 235/92 DP; 235/92 DN; 235/92 R
[58] Field of Search ........ 235/92 CA, 92 EV, 92 DP, 235/92 MT, 92 DN; 340/146.2

[56] References Cited

U.S. PATENT DOCUMENTS

| 3,760,356 | 9/1973 | Srivastava | 235/92 EA |
| 3,818,342 | 6/1974 | Stevens | 235/92 CA |
| 3,829,664 | 8/1974 | Kashio | 235/92 CA |
| 3,924,078 | 12/1975 | Bussey | 235/92 CA |
| 3,927,391 | 12/1975 | Cantrell | 340/146.2 |

Primary Examiner—Joseph M. Thesz
Attorney, Agent, or Firm—Hume, Clement, Brinks, Willian & Olds, Ltd.

[57] ABSTRACT

An electronic counter is provided for evaluating the impulses generated by digital electronic measuring system. This counter includes a register which counts the impulses generated by the digital electronic measuring system and generates a position reading, a memory unit, a comparator, and a control circuit. The control circuit is responsive to the output of the comparator and is adapted to store the position reading generated by the register in the memory unit if that reading is a more extreme value than the reading previously stored in the memory unit. In this manner, the extreme reading measured by the digital electronic measuring system during the measuring cycle is determined and stored in the memory unit.

6 Claims, 2 Drawing Figures

ELECTRONIC COUNTER

BACKGROUND OF THE INVENTION

This invention relates to an electronic increment/decrement counter for the evaluation of signals generated by a digital electronic measuring system.

Incremental measuring systems for measuring longitudinal position and angle are well known. Such systems are designed to generate electronic impulses which correspond to the movement of a sensor head. The integrated number of these impulses represents a measure of the position of the sensor head, which may correspond to linear displacement or angle of rotation. Typically, these impulses are counted with the aid of an electronic increment/decrement counter and the position reading is digitally displayed. According to the prior art, electronic increment/decrement counters may be provided with additional circuits by which it is possible, for example, to set the counter to zero, to set the counter to a reference value, or to cause the counter only to process the difference of the signals generated by two separate measuring systems.

SUMMARY OF THE INVENTION

The counter of this invention is an improvement over increment/decrement electronic counters of the prior art. This invention provides a counter which is relatively inexpensive to construct, yet can be applied in a versatile manner, and considerably simplifies many measuring operations while working free from many interferences.

The invention is adapted to selectively process extreme position readings (maximum or minimum readings) encountered in a measurement cycle. That is, the counter of this invention automatically records both the current position reading and the maximum or minimum position reading encountered in the measurement cycle. This counter includes a register in which the current position reading is stored as well as at least one memory unit, one comparator, and one logic unit. The comparator compares the position reading stored in the memory unit with the current position reading. The logic unit responds to the output of the comparator by loading the current position reading into the memory unit if it is an extreme reading.

The invention makes possible a broad application of electronic increment/decrement counters in connection with digital electronic measuring systems known in the prior art. Moreover, various measuring operations are simplified and rendered more dependable through the processing of extreme readings. In addition, the measuring time may be shortened considerably as a result of the invention in particular applications.

The novel features which are believed to be characteristic of the invention are set forth in the appended claims. The invention itself, together with further objects and attendant advantages, will be best understood by reference to the following description taken in connection with the accompanying drawings.

DETAILED DESCRIPTION OF TWO PREFERRED EMBODIMENTS

Figure 1:
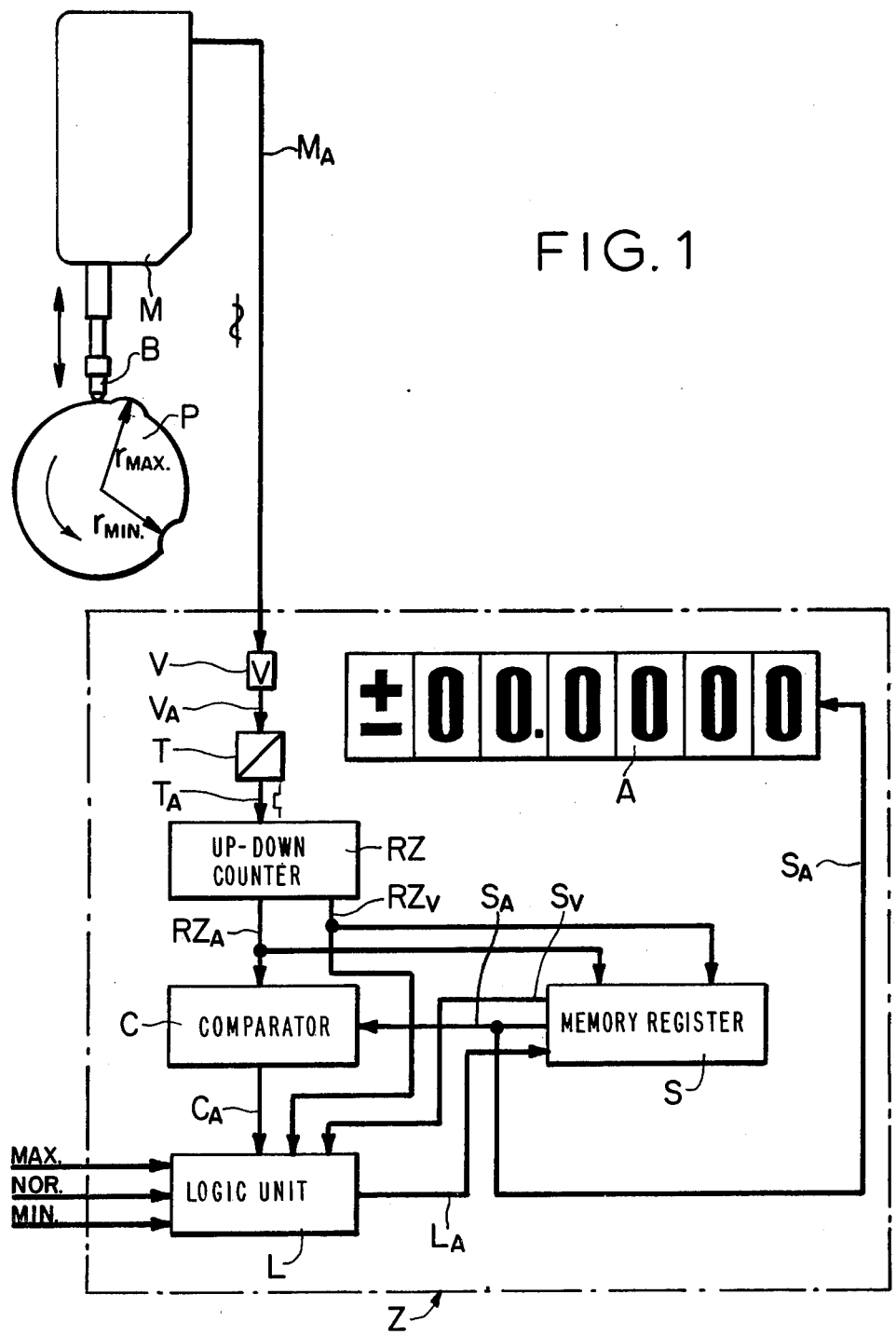
FIG. 1 shows a first embodiment of the invention which selectively processes either maximum or minimum readings.

In FIG. 1, the reference letter M identifies a digital longitudinal sensor which incrementally measures the profile of a test object P. The reference letter B identifies the measuring pin which forms the sensor head of the sensor M. The measuring pin B scans the object P to be examined. Digital longitudinal sensors of this kind are known and described, for example, in German Gebrauchsmuster No. 7,506,036.

The electronic output $M_A$ of the sensor M is a series of impulses which correspond to incremental movement of the pin B. The output $M_A$ is connected to an electronic increment/decrement counter Z which, upon receiving each impulse, increments or decrements the current position reading as appropriate. For this application, the counter Z updates the current position reading as described in the German Gebrauchsmuster No. 7,413,290.

Figure 2:
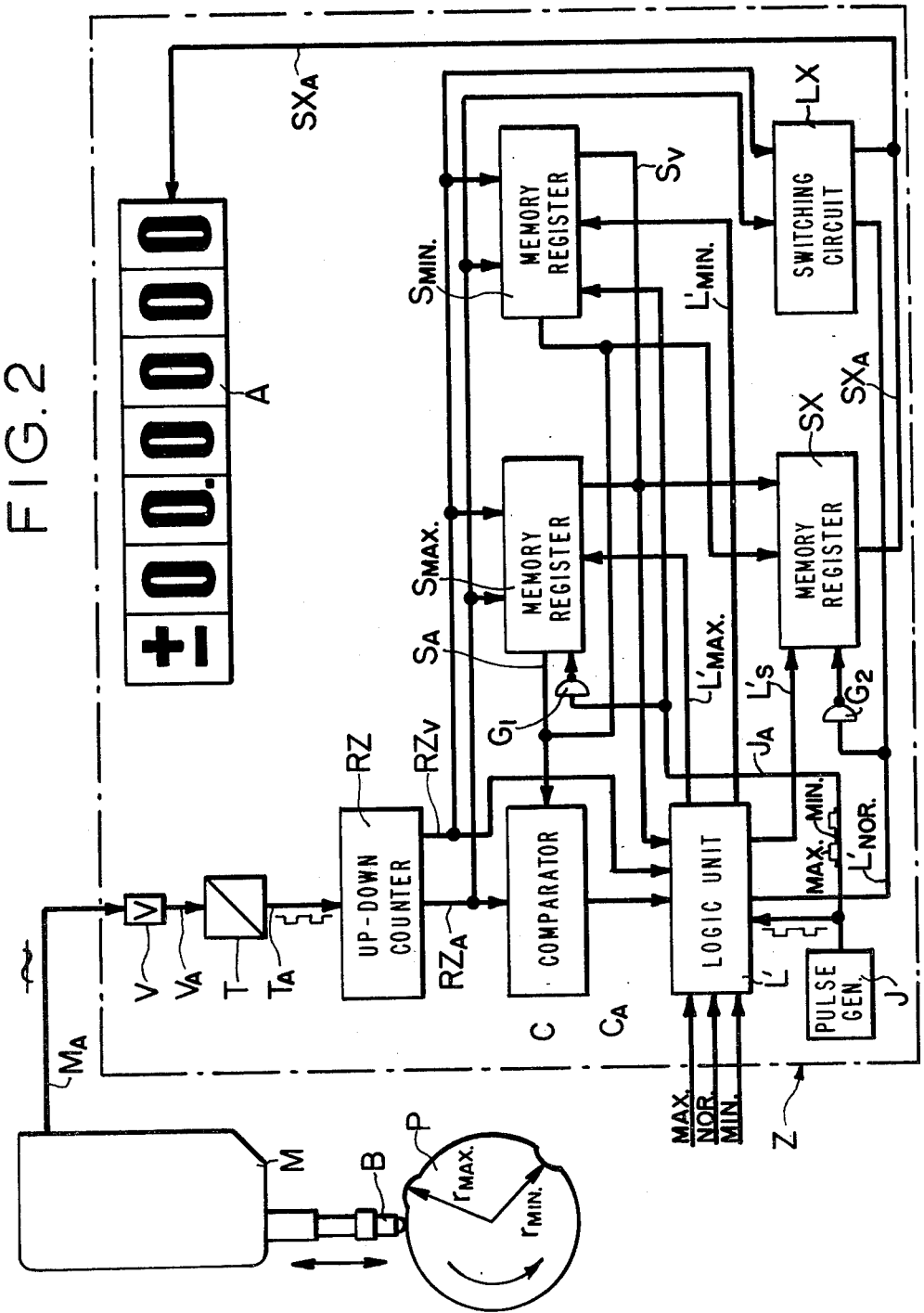
FIG. 2 shows a second embodiment of the invention which simultaneously processes maximum and minimum readings during one measurement cycle.

In FIG. 1, the counter Z includes an amplifier V and a trigger circuit T. The output of the sensor M is amplified in amplifier V and then the impulses are shaped in trigger circuit T and applied to the input of the current position register RZ. Register RZ counts the impulses generated by the sensor M by incrementing or decrementing the contents of the register RZ with the arrival of each impulse as appropriate. Register RZ is provided with two data outputs. The output line $RZ_V$ indicates whether a positive or negative value is stored in the register RZ, while the output line $RZ_A$ presents the position reading which is stored in the register RZ. According to this invention, circuits for the processing of extreme position readings are also provided in the counter Z. The embodiments shown in FIGS. 1 and 2 are adapted for the measurement of concentricity, and the extreme position readings will correspond to the maximum radius, $r_{max}$, and the minimum radius, $r_{min}$, of the object P being examined. A memory unit S and a comparator C are connected to the output $RZ_A$ of the current position register RZ. The comparator C is provided with two inputs: $RZ_A$ which provides the current position reading stored in the register RZ, and $S_A$ which provides the extreme position reading stored in the memory unit S. The comparator C compares these two readings and indicates at output $C_A$ whether the reading stored in the memory unit S or the register RZ is the extreme reading. Logic unit L is provided with three inputs: $C_A$ which provides the result of the comparison performed in the comparator C, $RZ_V$ which provides the sign of the reading stored in the register RZ, and $S_V$ which provides the sign of the reading stored in the memory unit S.

Logic unit L is provided with a control output $L_A$ which, when energized, causes the reading stored in the register RZ to be loaded into the memory unit S. Logic unit L is also provided with three control inputs labeled in FIG. 1 as MAX, NOR, and MIN. These inputs are used to select the desired mode of operation of the logic unit L. When the MAX input is selected, the logic unit L causes the maximum reading measured during the measuring cycle to be stored in the memory unit S and displayed. During MIN mode operation, the logic unit L causes the minimum reading measured during the measurement cycle to be stored and displayed. Finally, in the NOR mode, the logic unit L causes the current position reading, as stored in the register RZ, to be stored in the memory unit S and displayed. The component circuits of the counter Z are appropriately mounted on one common surface and are interconnected by way of conductor paths.

In the counter according to this invention, readings are interrogated in a sweep, compared, and, depending upon the comparative result, the current position reading may be loaded into the memory unit S. Under maximum reading processing, the memory unit S is loaded with the current position reading only if test circuits in the logic unit L indicate that the comparator C reports register value greater than memory value at positive sign of the register RZ, or register value smaller than memory value at negative sign in the register RZ and in the memory S, or register value greater or smaller than memory value with positive sign in the register RZ and negative sign in the memory. Under minimum reading processing, the memory unit S is loaded with the current position reading only if test circuits in the logic unit L indicate that the comparator C reports register value greater than memory value at negative sign in the register RZ, or register value smaller than memory value at positive sign in the register RZ and in the memory unit S, or register value smaller or greater than memory value at negative sign in the register RZ and positive sign in the memory S.

The counter according to the invention has multiple possible applications and may appropriately also contain the usual control circuits. For example, control circuits for resetting the counter to zero, for setting the counter equal to a preselected value, for causing the counter to record the difference between two inputs, or for indicating the diameter of a workpiece rather than the radius, may be provided.

FIG. 2 shows a counter $Z'$ which will record both the maximum reading and the minimum reading measured during the measurement cycle. The counter $Z'$ is provided with amplifier V, a trigger circuit T and a register RZ having outputs $RZ_A$ and $RZ_V$ which are identical to the corresponding elements described in connection with the embodiment of FIG. 1.

Two memory units $S_{MAX}$ and $S_{MIN}$ are connected to the outlets $RZ_A$ and $RZ_V$ of the directional discriminator counting register RZ. The outlets $S_A$ of the memory units $S_{MAX}$ and $S_{MIN}$ are connected to a comparator C which provides an input via the outlet $C_A$ to the control logic unit $L'$. The memory unit $S_{MAX}$ is used for the storage of maximum readings, and the memory unit $S_{MIN}$ is used for the storage of minimum readings. The memory units $S_{MAX}$ and $S_{MIN}$ are connected with the aid of a so-called "three state logic" which is known in the prior art and integrated in the memory units, $S_{MAX}$ and $S_{MIN}$. The memory units $S_{MAX}$ and $S_{MIN}$ are connected in parallel and so connected to the comparator C that the readings stored therein are consecutively compared with the contents of the register RZ. The logic unit $L'$ which appropriately includes a read only memory, or a programmable read only memory, operates with the prevailing result $C_A$ in the comparator C and the sign of the readings to be compared with each other, $RZ_V$ and $S_V$, to load the register value into the memory unit $S_{MAX}$ or $S_{MIN}$ when appropriate. In case of register values greater than the value in the memory for the maximum readings, the new higher register value is loaded into the memory unit $S_{MAX}$. In case of register values smaller than the value in the memory for the minimum readings, the new lower register value is loaded into the memory unit $S_{MIN}$. This counter may operate in any one of three display modes, MAX, MIN and NOR, previously described in connection with the embodiment of FIG. 1. This counter $Z'$ contains a third memory unit SX which is connected to the output $L'_S$ of the logic unit $L'$ and to the outputs $S_A$ and $S_V$ of the two memory units $S_{MAX}$ and $S_{MIN}$. The sign of the register RZ and of the memory units $S_{MAX}$ and $S_{MIN}$ are fed into the logic unit $L'$ via the outputs $RZ_V$ and $S_V$ respectively. Control signals from the logic unit $L'$ to the memory units $S_{MAX}$, $S_{MIN}$ or SX are issued via the outputs $L'_{MAX}$, $L'_{MIN}$ and $L'_S$, respectively.

The reference letter J identifies an impulse generator whose signal is applied via output $J_A$ to the logic unit $L'$, to the memory unit $S_{MIN}$, and via the gate $G_1$ is inverted and applied to the memory $S_{MAX}$. It can be seen from the circuit in FIG. 2 that with the binary signal of the impulse generator J in the logic 1 state only maximum readings are compared and loaded, while with the binary signal in the logic zero state, only minimum readings are compared and loaded.

Moreover, the memory SX is followed by three state logic circuit LX known in the prior art. The outputs $RZ_A$ and $RZ_V$ of the register RZ and the output $L'_{NOR}$ of the logic unit $L'$ are connected to the circuit LX. The output $L'_{NOR}$ also is inverted by gate $G_2$ and applied to the memory SX. Th digital display A is controlled by output $SX_A$ of the circuits SX or LX. When the logic unit $L'$ is operating in the NOR mode, the $L'_{NOR}$ output disables the memory unit SX and enables the circuit LX so as to cause the contents of the register RZ to be displayed at digital display A. Alternately, when the logic unit $L'$ is in the MAX or MIN display mode, the $L'_{NOR}$ output enables the memory unit SX and disables the circuit LX. Furthermore, the $L'_S$ output controls the memory unit SX so that either the contents of memory unit $S_{MAX}$ or $S_{MIN}$ as desired is displayed at digital display A.

Of course, it should be understood that various changes and modifications to the preferred embodiments described herein will be apparent to those skilled in the art. Such changes and modifications can be made without departing from the scope of the present invention and without diminishing its attendant advantages. It is, therefore, intended that such changes and modifications be covered by the following claims.

I claim:

1. An electronic incrementing/decrementing counter for evaluating impulses representative of both positive and negative increments generated by digital electronic measuring means comprising:

register means for counting the impulses generated by the measuring means and generating a first signed integer position reading;

memory means for storing a second signed integer position reading previously generated by the register means;

comparator means for comparing the first position reading with the second position reading and indicating the result of this comparison at an output; and control means responsive to the output of the comparator means and the sign of the first and second position readings for loading the first position reading into the memory means when the first position reading is a more extreme reading than the second position reading, said control means operative both when the sign of the first and second position readings are disparate and when the sign of the first and second readings are equal.

2. The counter defined in claim 1 wherein the control means is adapted to selectively function in a first mode in which the control means loads the first position reading into the memory means when the first position reading is greater than the second position reading, and a second mode in which the control means loads the first position reading into the memory means when the first position reading is less than the second position reading.

3. The counter defined in claim 1 wherein:
the memory means comprises a first memory unit adapted to store a second position reading generated by the register means and a second memory unit adapted to store a third position reading generated by the register means;
the control means is adapted to operate sequentially in a first and second mode; and further, wherein
the control means, when operating in the first mode, causes the comparator means to compare the first and second readings and loads the first reading into the first memory unit if the first reading is greater than the second reading; and when operating in the second mode, causes the comparator means to compare the first and third readings and loads the first reading into the second memory unit if the first reading is less than the third reading such that both the maximum and the minimum readings are automatically determined and stored in the first and second memory units, respectively.

4. The counter defined in claim 3 further comprising:
a third memory unit which is connected with the first and second memory units; and
selection means for selectively operating in a first mode in which the selection means loads the contents of the first memory unit into the third memory unit and a second mode in which the selection means loads the contents of the second memory unit into the third memory unit.

5. The counter defined in claim 1 in which the control means comprises a read only memory.

6. An electronic incrementing/decrementing counter for evaluating impulses representative of both positive and negative increments generated by digital electronic measuring means comprising:
register means for counting the impulses generated by the measurement means to generate a first signed integer position reading;
memory means for storing a second reading previously generated by the register means;
comparator means for generating an output signal when the magnitude of the first reading is greater than the magnitude of the second reading;
control means provided with inputs which report the sign of the first reading, the sign of the second reading, and the output of the comparator means, which control means includes
a first test circuit which generates a first test signal when the first reading is positive and the comparator output signal is present;
a second test circuit which generates a second test signal when the first and second readings are negative and the comparator output signal is absent;
a third test circuit which generates a third test signal when the first reading is positive and the second reading is negative;
a fourth test circuit which generates a fourth test signal when the first reading is negative and the comparator output is present;
a fifth test circuit which generates a fifth test signal when the first and second readings are positive and the comparator output is absent;
a sixth test circuit which generates a sixth test signal when the first reading is negative and the second reading is positive; and
mode selection means which causes the control means to selectively function in a first mode in which the first reading is loaded into the memory means when the first, second, or third test signal is generated, and a second mode in which the first reading is loaded into the memory means when the fourth, fifth, or sixth test signal is generated.

* * * * *